United States Patent
Renau et al.

(10) Patent No.: US 7,459,692 B2
(45) Date of Patent: Dec. 2, 2008

(54) ELECTRON CONFINEMENT INSIDE MAGNET OF ION IMPLANTER

(75) Inventors: Anthony Renau, West Newbury, MA (US); Joseph C. Olson, Beverly, MA (US); Shengwu Chang, South Hamilton, MA (US); James Buff, Brookline, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 424 days.

(21) Appl. No.: 11/272,193

(22) Filed: Nov. 10, 2005

(65) Prior Publication Data

US 2006/0169911 A1    Aug. 3, 2006

Related U.S. Application Data

(60) Provisional application No. 60/629,515, filed on Nov. 19, 2004.

(51) Int. Cl.
 *H01J 1/50* (2006.01)
(52) U.S. Cl. .................... 250/396 ML; 250/396 R; 250/400; 250/492.21
(58) Field of Classification Search ............ 250/396 R–396 ML
See application file for complete search history.

(56) References Cited

U.S. PATENT DOCUMENTS

| | | | |
|---|---|---|---|
| 4,383,177 A | 5/1983 | Keller et al. | |
| 5,132,544 A | 7/1992 | Glavish et al. | |
| 5,206,516 A | 4/1993 | Keller et al. | |
| 5,703,375 A * | 12/1997 | Chen et al. | 250/492.21 |
| 6,414,329 B1 | 7/2002 | Benveniste et al. | |
| 2002/0179854 A1 | 12/2002 | Tsukihara et al. | |
| 2003/0122090 A1 | 7/2003 | Tsukihara et al. | |
| 2004/0107909 A1* | 6/2004 | Collins et al. | 118/723.001 |

* cited by examiner

*Primary Examiner*—Jack I Berman
*Assistant Examiner*—Andrew Smyth

(57) ABSTRACT

A method and apparatus are disclosed for improving space charge neutralization adjacent a magnet of an ion implanter by confining the electrons inside a magnetic region thereof to reduce electron losses and therefore improve the transport efficiency of a low energy beam. A magnetic pole member for a magnet of an ion implanter is provided that includes an outer surface having a plurality of magnetic field concentration members that form magnetic field concentrations adjacent the magnetic pole member. Electrons that encounter this increased magnetic field are repelled back along the same magnetic field line rather than allowed to escape. An analyzer magnet and ion implanter including the magnet pole are also provided so that a method of improving low energy ion beam space charge neutralization in an ion implanter is realized.

23 Claims, 5 Drawing Sheets

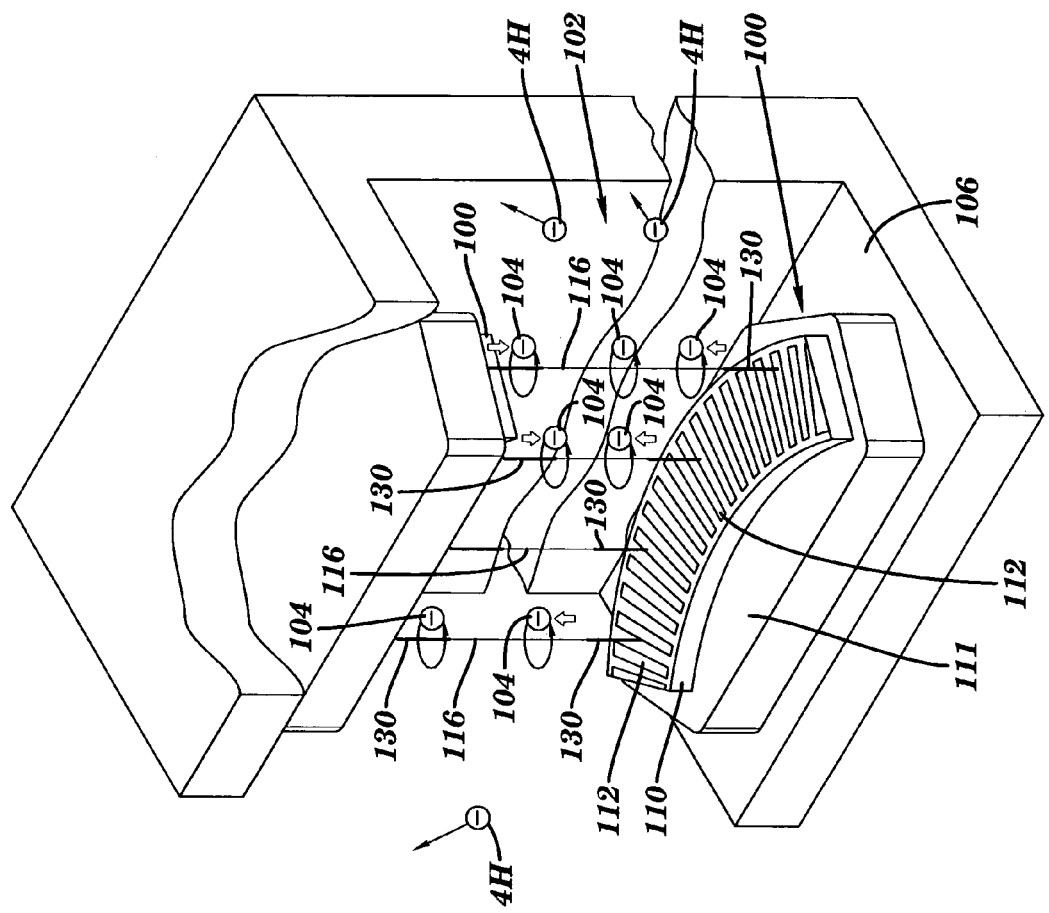
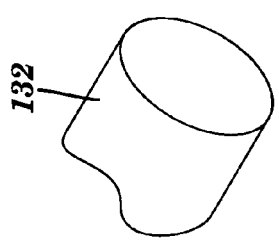
FIG. 2

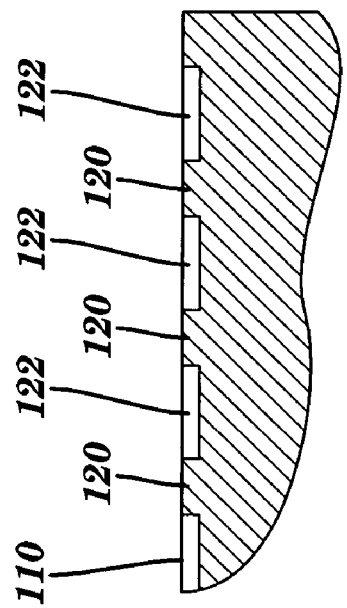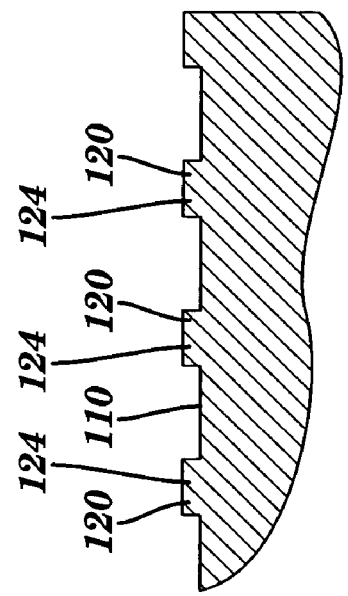

ELECTRON CONFINEMENT INSIDE MAGNET OF ION IMPLANTER

RELATED APPLICATIONS

This application claims priority to U.S. Provisional Application No. 60/629,515, entitled "Electron Confinement Inside Magnet of Ion Implanter," filed on Nov. 19, 2004, the contents of which are herein incorporated by reference in their entirety.

BACKGROUND OF THE INVENTION

1. Technical Field

The present invention relates generally to ion implanters, and more particularly, to a method and apparatus for confining electrons inside a magnetic region of a magnet of an ion implanter.

2. Related Art

Improving productivity in ion implanters that use a low energy beam is a continuing issue in the ion implanter industry. One area of focus is improving beam transport efficiency. In particular, on single wafer ion beam implant systems, the ion beam is decelerated from high energy to low energy by an electrostatic bi-potential lens positioned before an analyzer magnet. An analyzer magnet functions to refine an ion beam by selecting appropriate ions for the ion beam. In any ion beam, ions of like charge tend to repel each other, which cause the ion beam to disperse. As an ion beam decelerates from high energy to low energy, the ion dispersion problem increases, which may result in the ion beam transport loss due to the repulsion.

As shown in FIG. 1, one mechanism to reduce ion beam 2 dispersion is to maintain a sufficient amount of free electrons 4 (e.g., via beam collisions with neutral atoms 6) within ion beam 2 to neutralize the net space charge of ion beam 2. Free electrons 4 can be introduced from an external source (not shown) to ion beam 2 in the regions where there is no magnetic field. Free electrons 4 can also be produced by ion beam 2 colliding with surfaces (not shown) about it, and from ion beam 2 colliding with residual gas (not shown). However, heating of free electrons 4 from collisions produces hot electrons 4H that can escape from ion beam 2 to the walls of the beam-line. As this occurs, electrons 4L are lost, thereby increasing the net space charge of ion beam 2 when additional free electrons 4 are not supplied to ion beam 2. The space charge neutralization problem is heightened inside a magnetic region 10 of a magnet 12 because free electrons 4 cannot move into magnetic region 10 from outside of magnetic region 10 as they orbit about magnetic field lines 16. The replacement of lost electrons 4L in magnetic region 10 is usually accomplished by relying on ion beam 2 generated electrons. At the same time, the magnetic field of magnet 12 tends to guide hot electrons 4H to migrate to planar poles 14 of magnet 12 and thus enhance the exit of lost electrons 4L from ion beam 2. This situation can lead to ion beam 2 expansion and further cause ion beam 2 transport losses if ion beam 2 generated electrons in magnetic region 10 are not adequate to replace lost electrons 4L. It should be recognized that while magnet 12 is illustrated as an analyzer magnet, the problem is not limited to this particular magnet within an ion implanter.

In view of the foregoing, there is a need in the art for improved beam transport efficiency in a magnet of an ion implanter.

SUMMARY OF THE INVENTION

The invention includes a method and apparatuses for improving space charge neutralization adjacent a magnet of an ion implanter by confining the electrons inside a magnetic region thereof to reduce electron losses and therefore improve the transport efficiency of a low energy beam. The invention includes a magnetic pole member for a magnet of an ion implanter that includes an outer surface having a plurality of magnetic field concentration members that form magnetic field concentrations adjacent the magnetic pole member. Electrons that encounter this increased magnetic field are repelled back along the same magnetic field line rather than allowed to escape. The invention also includes an analyzer magnet and ion implanter including the magnet pole and a method of improving low energy ion beam space charge neutralization in an ion implanter.

A first aspect of the invention is directed to a magnet pole for a magnet for use in an ion implanter, the magnet pole comprising: a magnetic member for mounting to an internal portion of the magnet, the magnetic member including an outer surface including a plurality of magnetic field concentration members that form magnetic field concentrations adjacent the magnetic member.

A second aspect of the invention includes a method of improving low energy ion beam space charge neutralization in an ion implanter, the method comprising the steps of: forming magnetic field concentrations adjacent a magnet pole of a magnet of the ion implanter to confine electrons adjacent the magnet; and introducing the low energy ion beam into the magnet such that the confined electrons are introduced into the low energy ion beam adjacent the magnet.

A third aspect of the invention includes an analyzer magnet for an ion implanter, the analyzer magnet comprising: a magnetic pole member for mounting to an internal portion of the analyzer magnet, the magnetic pole member including an outer surface including magnetic field concentration members that form magnetic field concentrations adjacent the internal portion.

A fourth aspect includes an ion implanter comprising: an ion source for generating an ion beam; a magnet including at least one magnetic pole member having an outer surface including a plurality of magnetic field concentration members that form magnetic field concentrations adjacent the magnetic member; and an implant chamber for holding a target to be implanted by the ion beam.

A fifth aspect includes an analyzer magnet for an ion implanter, the analyzer magnet comprising: a magnetic pole; and means for forming magnetic field concentrations adjacent the magnetic pole.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 2 shows an exploded view of a magnet including a magnetic pole member according to the invention;

FIG. 5 shows a detailed view of one embodiment of the magnetic pole member of FIG. 3;

FIG. 6 shows a detailed view of a second embodiment of the magnetic pole member of FIG. 3.

DETAILED DESCRIPTION OF THE INVENTION

Figure 1:
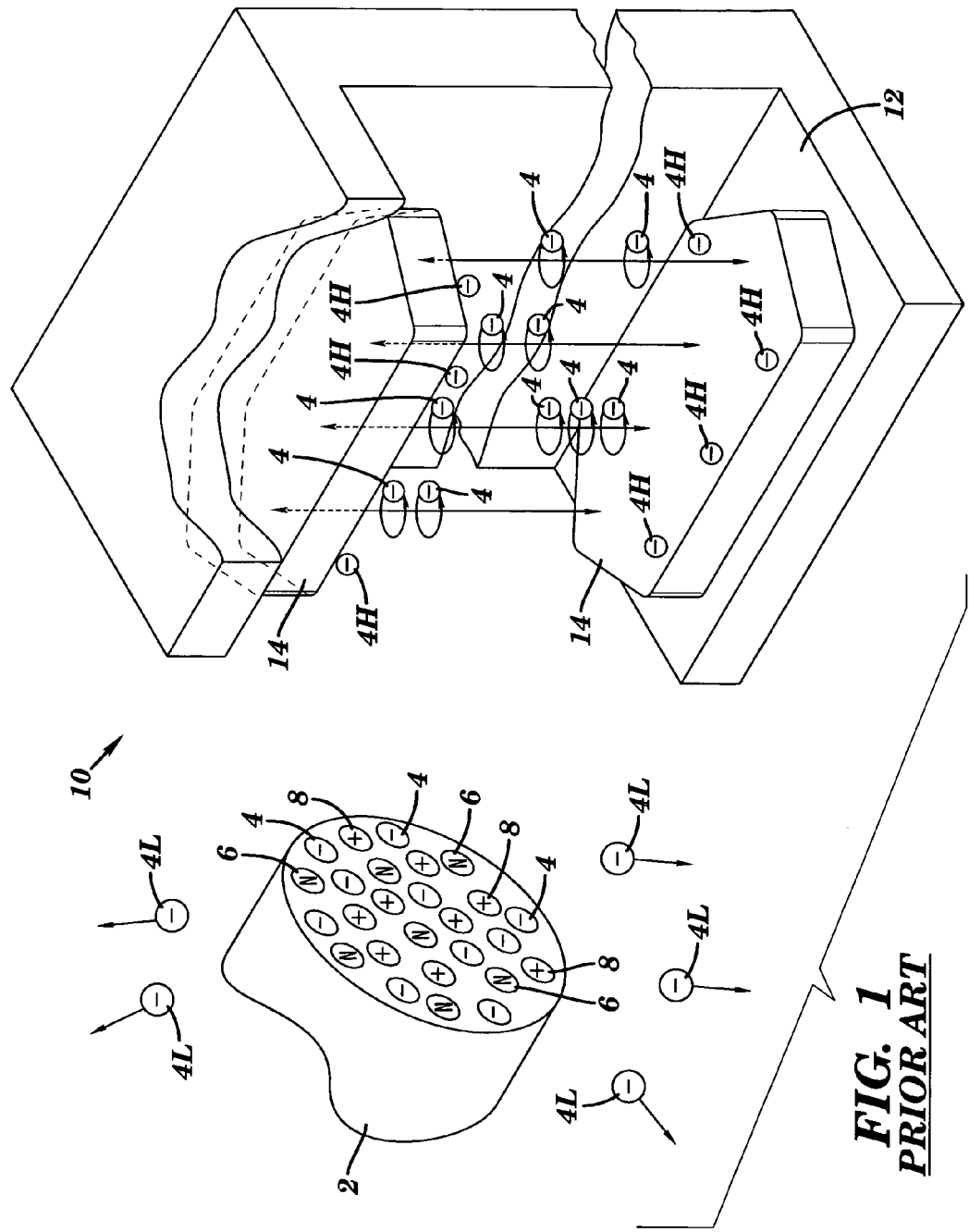
FIG. 1 shows an exploded view of a conventional magnet of an ion implanter.

With reference to the accompanying drawings, FIG. 2 illustrates a magnetic pole member 100 for a magnet 102 of an ion implanter according to the invention. As illustrated, magnet 102 is configured as an analyzer magnet. The coils of magnet 102 are not shown for clarity. It should be recognized, however, that the teachings of the invention as applicable to any magnet within an ion implanter. As shown in FIG. 2, magnetic pole member 100 is configured for mounting to an internal portion 106 of magnet 102. Magnetic pole member 100 includes an outer surface 110 that is, in one embodiment, raised from a base 111. Magnetic pole member 100 may be constructed of any now known or later developed magnetic material usable within a magnet 102.

Figure 3:
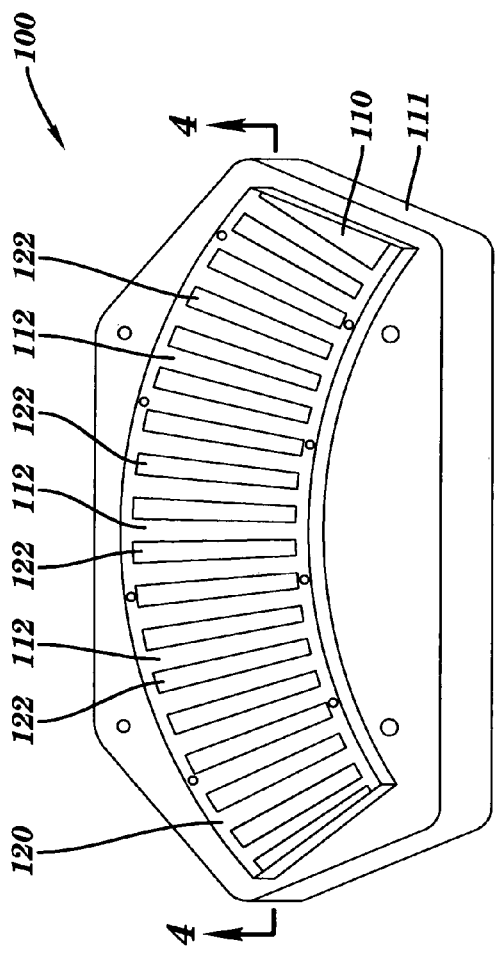
FIG. 3 shows a perspective view of the magnetic pole member of FIG. 2.
Figure 4:
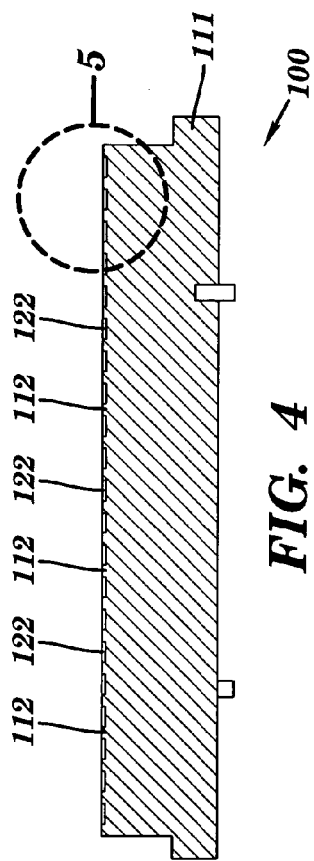
FIG. 4 shows a cross-sectional view of the magnetic pole member of FIG. 3.

Magnetic pole member 100 also includes a plurality of magnetic field concentration members 112 that form concentrated magnetic fields 130 (indicated by thicker magnetic field lines in FIG. 2) adjacent magnetic pole member 100. As best shown in FIGS. 2 and 3, each magnetic pole member 100 has a curvilinear shape matching the internal portion 106 (FIG. 2 only). As shown in FIGS. 2 and 3, magnetic field concentration members 112, in one embodiment, extend radially along the curvilinear shape, although this may not always be necessary. Magnetic field concentration members 112 may be provided in a variety of forms. In one preferred embodiment, as shown in FIGS. 5 and 6 only, each magnetic field concentration member includes a ridge 120 on outer surface 110. As shown in FIGS. 3-5, ridges 120 can be formed by furrows 122 in outer surface 110. Alternatively, as shown in FIG. 6, ridges 120 can be formed as raised portions 124 from outer surface 110.

Referring to FIG. 2, in operation, magnetic field concentration members 112 create a magnetic mirroring situation for magnet 102. "Magnetic mirroring" indicates a situation in which charged particles avoid traveling in a direction of increasing magnetic field and simply travel in a mirrored-path along magnetic field lines. In this setting, concentration members 112 create small magnetic field concentrations 130 (indicated by thicker magnetic field lines 116 in FIG. 2) that provide an increased magnetic field at the end of the magnetic field lines. Electrons 104 (mirrored or trapped electrons) that encounter this increased magnetic field are repelled back along the same magnetic field line 116 rather than allowed to escape to, for example, surrounding walls (not shown) of magnet 102. As a result, these electrons 104 are available to repopulate ion beam 132. Magnetic pole member 100 accordingly confines electrons without additional devices and without affecting ion beam 132.

The invention also includes a method of improving low energy ion beam space charge neutralization in an ion implanter including: forming magnetic field concentrations 130 adjacent a magnet pole 100 of a magnet 102 of the ion implanter to confine electrons 104 adjacent the magnet; and introducing the low energy ion beam 132 into magnet 102 such that the confined electrons 104 are introduced into the low energy ion beam 132 adjacent magnet 102.

Figure 7:
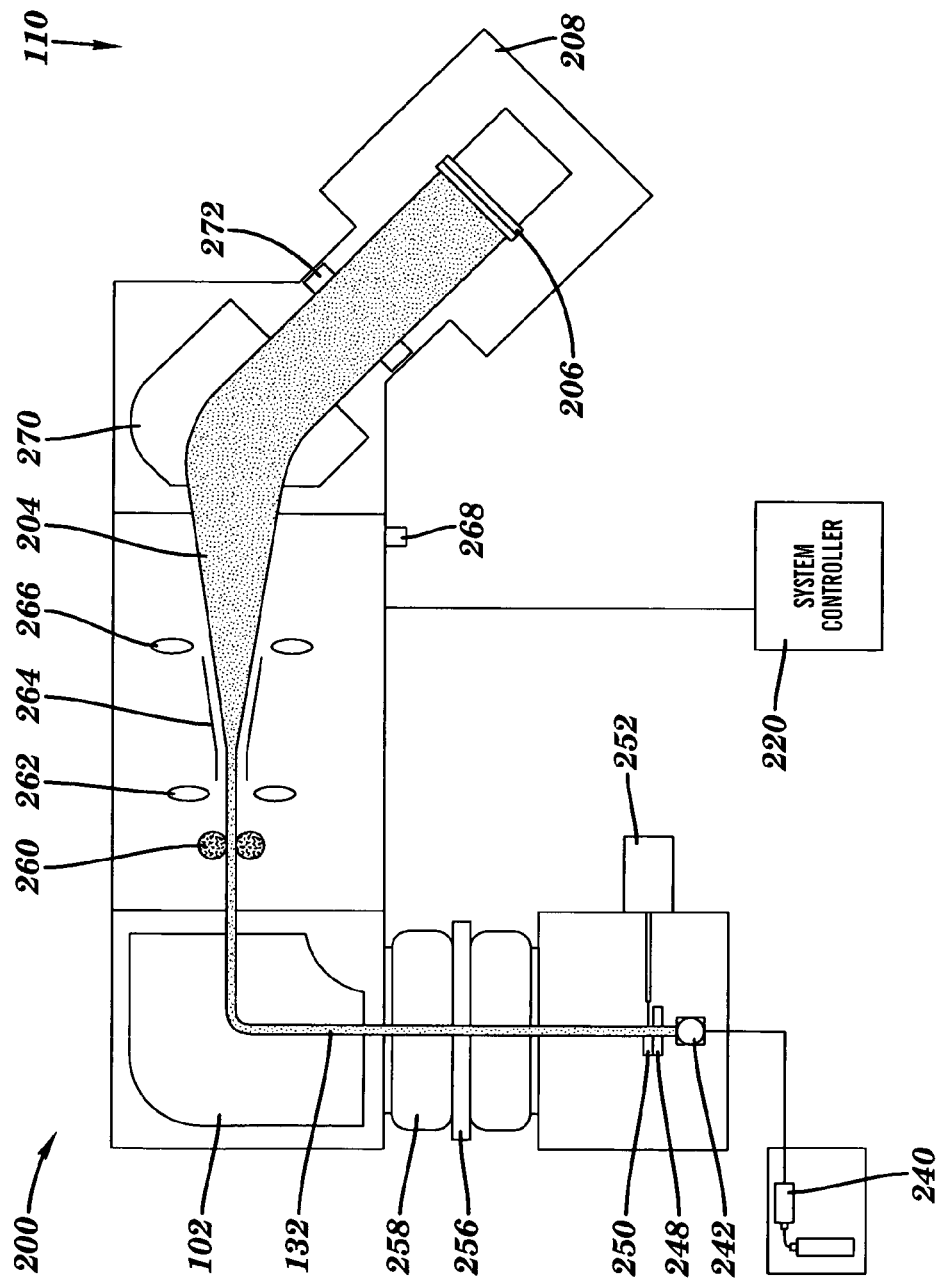
FIG. 7 shows a plan view of an ion implanter including the magnet of FIG. 2 as an analyzer magnet.

As shown in FIG. 7, the invention also includes an ion implanter 200 including, inter alia, an ion source 242 for generating an ion beam 132; the above-described magnet 102 (illustrated as analyzer magnet); and an implant chamber 208 for holding a target 206 to be implanted by ion beam 132. Besides the above-described components, ion implanter 200 may include a gas flow 240; a suppression electrode 248 for focusing ion beam 132; an extraction electrode 250; one or more manipulator motors 252 for suppression/extraction electrodes 248, 250; a deceleration system 258 to decelerate ion beam 132; a mass slit 260; a pre-scan suppression electrode 262; horizontal scan plates 264; a post-scan suppression electrode 266; a nitrogen ($N_2$) bleed 268; a corrector magnet 270; and a limiting aperture 272. Deceleration system 258 may include a focusing electrode 256 to focus ion beam 132. Deceleration system 258 may be configured so that it can also function as an acceleration system to increase the energy of ion beam 132. Each of the above-described components including analyzer magnet 102 is monitored by and responsive to system controller 220. Although a sample ion implanter 200 structure has been illustrated, it should be recognized that the teachings of the invention can be applied to any ion implanter.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A magnet pole for a magnet for use in an ion implanter, the magnet pole comprising:
    a magnetic member for mounting to an internal portion of the magnet, the magnetic member including an outer surface having a non-planar shape defined at least in part by a plurality of magnetic field concentration members that form magnetic field concentrations adjacent the magnetic member.

2. The magnet pole of claim 1, wherein the magnetic member has a curvilinear shape matching the internal portion.

3. The magnet pole of claim 2, wherein the plurality of magnetic field concentration members extend radially along the curvilinear shape.

4. The magnet pole of claim 1, wherein each magnetic field concentration member includes a ridge.

5. The magnet pole of claim 4, wherein each ridge is raised from the outer surface.

6. The magnet pole of claim 4, wherein each ridge is formed by furrows in the outer surface.

7. The magnet pole of claim 1, wherein the magnetic member includes a base and the outer surface is raised from the base.

8. A method of improving low energy ion beam space charge neutralization in an ion implanter, the method comprising the steps of:
    forming magnetic field concentrations adjacent first and second magnet pole of a magnet of the ion implanter with a first magnetic member mounted to the first magnet pole and a second magnetic member mounted to the second magnet pole, each magnetic member including an outer surface having a non-planar shape defined at least in part by a plurality of magnetic field concentration members; and
    introducing the low energy ion beam into a gap defined by the first and second magnet pole.

9. An analyzer magnet for an ion implanter, the analyzer magnet comprising:
    a magnetic pole member for mounting to an internal portion of the analyzer magnet, the magnetic pole member including an outer surface including magnetic field concentration members that form magnetic field concentrations adjacent the internal portion, wherein each magnetic field concentration member includes a ridge, and wherein the analyzer magnet includes a magnetic pole member at a first end and a second end thereof.

10. The analyzer magnet of claim 9, wherein the internal portion and the magnetic pole member have a curvilinear shape.

11. The analyzer magnet of claim 10, wherein the magnetic field concentration members extend radially along the curvilinear shape.

12. The analyzer magnet of claim 9, wherein the magnetic pole member includes a base and the outer surface is raised from the base.

13. The analyzer magnet of claim 9, wherein each ridge is raised from the outer surface.

14. The analyzer magnet of claim 9, wherein each ridge is formed by furrows in the outer surface.

15. An ion implanter comprising:
an ion source for generating an ion beam;
a magnet including at least one magnetic pole member having an outer surface including a plurality of magnetic field concentration members that form magnetic field concentrations adjacent the magnetic member, wherein the magnet includes a magnetic pole member at a first end and a second end thereof; and
an implant chamber for holding a target to be implanted by the ion beam.

16. The ion implanter of claim 15, wherein the magnetic pole member has a curvilinear shape.

17. The ion implanter of claim 15, wherein each of the plurality of magnetic field concentration members includes a ridge.

18. The ion implanter of claim 17, wherein each ridge extends radially along a curvilinear shape of the magnetic pole member.

19. The ion implanter of claim 17, wherein each ridge is raised from the outer surface.

20. The ion implanter of claim 17, wherein each ridge is formed by furrows in the outer surface.

21. The ion implanter of claim 15, wherein each magnetic pole member includes a base and the outer surface is raised from the base.

22. The ion implanter of claim 15, wherein the magnet is an analyzer magnet of the ion implanter.

23. The ion implanter of claim 15, further comprising a deceleration system for decelerating the ion beam.

* * * * *